(12) United States Patent
Ishii

(10) Patent No.: US 7,322,881 B2
(45) Date of Patent: Jan. 29, 2008

(54) EXHAUST DEVICE

(75) Inventor: Hiroshi Ishii, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/280,353

(22) Filed: Nov. 17, 2005

(65) Prior Publication Data

US 2006/0116065 A1  Jun. 1, 2006

(30) Foreign Application Priority Data

Nov. 26, 2004  (JP) .............................. 2004-343107

(51) Int. Cl.
 B60H 1/34 (2006.01)
 G03G 21/20 (2006.01)
 G03G 1/34 (2006.01)
(52) U.S. Cl. ........................ 454/155; 399/92
(58) Field of Classification Search ............... 454/184, 454/347, 355
See application file for complete search history.

(56) References Cited

U.S. PATENT DOCUMENTS

| 6,102,660 A * | 8/2000 | Lee ........................ 416/146 R |
| 6,647,223 B2 | 11/2003 | Ishii |
| 6,898,407 B2 | 5/2005 | Noguchi et al. |
| 6,937,838 B2 | 8/2005 | Ishii et al. |
| 2002/0025180 A1 * | 2/2002 | Kimizuka et al. ............ 399/92 |
| 2004/0131380 A1 | 7/2004 | Kuma et al. |
| 2004/0208676 A1 | 10/2004 | Ishii et al. |
| 2005/0008393 A1 | 1/2005 | Kuma et al. |
| 2005/0036810 A1 | 2/2005 | Murakami et al. |
| 2005/0084293 A1 | 4/2005 | Fukuchi et al. |
| 2005/0169653 A1 | 8/2005 | Noguchi et al. |

FOREIGN PATENT DOCUMENTS

JP    2002-248836    9/2002

OTHER PUBLICATIONS

JP 2002-248836 Masahiko, English translation.*

* cited by examiner

Primary Examiner—Steven McAllister
Assistant Examiner—Helena Kosanovic
(74) Attorney, Agent, or Firm—Oblon, Spivak, McClelland, Maier & Neustadt, P.C.

(57) ABSTRACT

An exhaust device is used to exhaust air from inside of an apparatus to outside. The exhaust device includes a louver with blades arrayed in a lattice, the louver being detachably engaged with a trough hole in a cover of the apparatus such that the louver can rotate freely in a clockwise and a counterclockwise direction. A fan unit provided separately from the louver is positioned upstream in an airflow direction than the louver, so as not to rotate when the louver is rotated. The blades form an angle between 0° and 90° with a plane perpendicular to a central axis of the louver.

7 Claims, 8 Drawing Sheets

EXHAUST DEVICE

CROSS-REFERENCE TO RELATED APPLICATIONS

The present document incorporates by reference the entire contents of Japanese priority document, 2004-343107 filed in Japan on Nov. 26, 2004.

BACKGROUND OF THE INVENTION

1. Field of the Invention

The present invention relates to an exhaust device that discharges air from inside an image forming apparatus.

2. Description of the Related Art

An exhaust device is generally used to discharge hot air or dust from inside of an image forming apparatus to outside thereof. A copying machine, a printer, a facsimile, or a composite machine are the example of an image forming apparatus.

Japanese Patent Laid-Open Publication No. 2002-248836 discloses an example of such an exhaust device. This conventional exhaust device includes a louver consisting of a plurality of blades arrayed in a lattice shaped formation and a fan that is attached to the louver. The louver is fixed to a bracket hole in an external cover of the image forming apparatus. When the fan rotates, air inside the image forming apparatus is discharged outside via slits between the blades of the louver. The louver is rotatably mounted on the external cover of the image forming apparatus to enable control of the direction of air that flows out via the louver.

In the conventional exhaust device, however, because the fan is attached to the louver and rotates with the louver, the louver cannot be rotated more than 360° so as not to cut a fan motor harness. Thus, there was a need of an exhaust device that can rotate freely.

SUMMARY OF THE INVENTION

It is an object of the present invention to at least solve the problems in the conventional technology.

According to an aspect of the present invention, an exhaust device suitably used to exhaust air from an inside of a target apparatus to an outside thereof includes a louver that includes a plurality of blades arrayed in a lattice, the louver being detachably engaged with a through hole in a cover of the target apparatus such that the louver can rotate freely in any of a clockwise direction and a counterclockwise direction, and a fan unit positioned upstream in an airflow direction than the louver, wherein the fan unit is provided separately from the louver such that the fan unit does not rotate when the louver is rotated, wherein the blades form an angle between 0° and 90° with a plane that is perpendicular to a central axis of the louver.

According to another aspect of the present invention, an exhaust device suitably used to exhaust air from an inside of a target apparatus to an outside thereof, includes a louver that includes a plurality of blades arrayed in a lattice, a holder that detachably engages with the louver, the holder being detachably engaged with a through hole in a cover of the target apparatus such that the louver and the holder can rotate freely in any of a clockwise direction and a counterclockwise direction, a filter that is accommodated in an internal space that is formed when the holder is engaged with the louver, and a fan unit positioned upstream in an airflow direction than the louver, wherein the fan unit is provided separately from the louver and the holder such that the fan unit does not rotate when the louver and the holder are rotated, wherein the holder includes vent holes that are positioned opposite the blades when the holder is engaged with the louver, and the blades form an angle between 0° and 90° with a plane that is perpendicular to a central axis of the holder and the louver.

According to still another aspect of the present invention, an image forming apparatus includes a cover, an image forming unit inside the cover, and an exhaust device suitably used to exhaust air from an inside of the image forming apparatus to an outside thereof, including a louver that includes a plurality of blades arrayed in a lattice, the louver being detachably engaged with a through hole in the cover such that the louver can rotate freely in any of a clockwise direction and a counterclockwise direction, and a fan unit positioned upstream in an airflow direction from the louver, wherein the fan unit is provided separately from the louver such that the fan unit does not rotate when the louver is rotated, wherein the blades form an angle between 0° and 90° with a plane that is perpendicular to a central axis of the louver.

According to still another aspect of the present invention, an image forming apparatus includes a cover, an image forming unit inside the cover, and an exhaust device suitably used to exhaust air from an inside of the image forming apparatus to an outside thereof, including a louver that includes a plurality of blades arrayed in a lattice, a holder that detachably engages with the louver, the holder being detachably engaged with a through hole in the cover such that the louver and the holder can rotate freely in any of a clockwise direction and a counterclockwise direction, a filter that is accommodated in an internal space that is formed when the holder is engaged with the louver, and a fan unit positioned upstream in an airflow direction from the louver, wherein the fan unit is provided separately from the louver and the holder such that the fan unit does not rotate when the louver and the holder are rotated, wherein the holder includes vent holes that are positioned opposite the blades when the holder is engaged with the louver, and the blades form an angle between 0° and 90° with a plane that is perpendicular to a central axis of the holder and the louver.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments of the present invention will be described below with reference to accompanying drawings. The present invention is not limited to these embodiments.

An exhaust device according to an embodiment of the present invention can be used in various devices such as a vacuum cleaner, an air purifier, a generator, an air conditioner, and a computer. An embodiment is explained below in which the exhaust device is used in an image forming apparatus.

Figure 1:
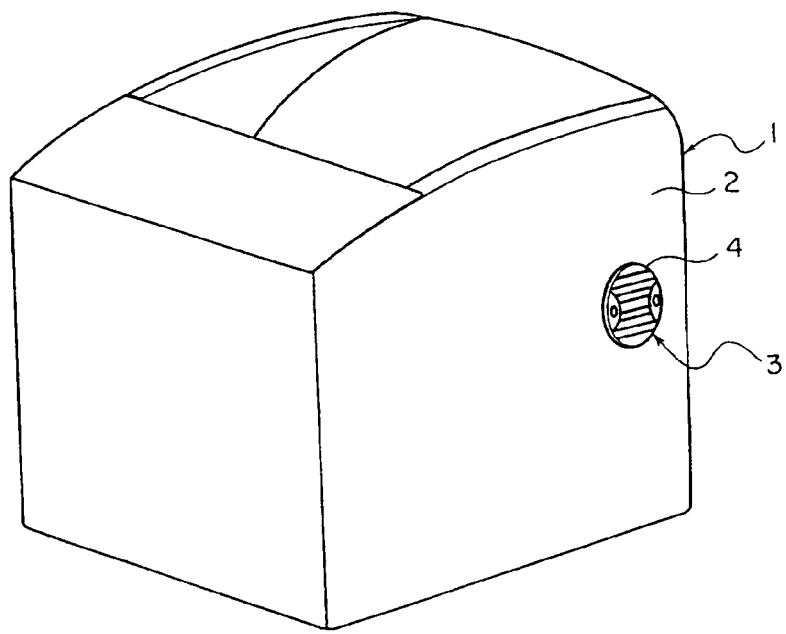
FIG. 1 is a perspective external view of an image forming apparatus including an exhaust device according to an embodiment of the present invention.
Figure 2:
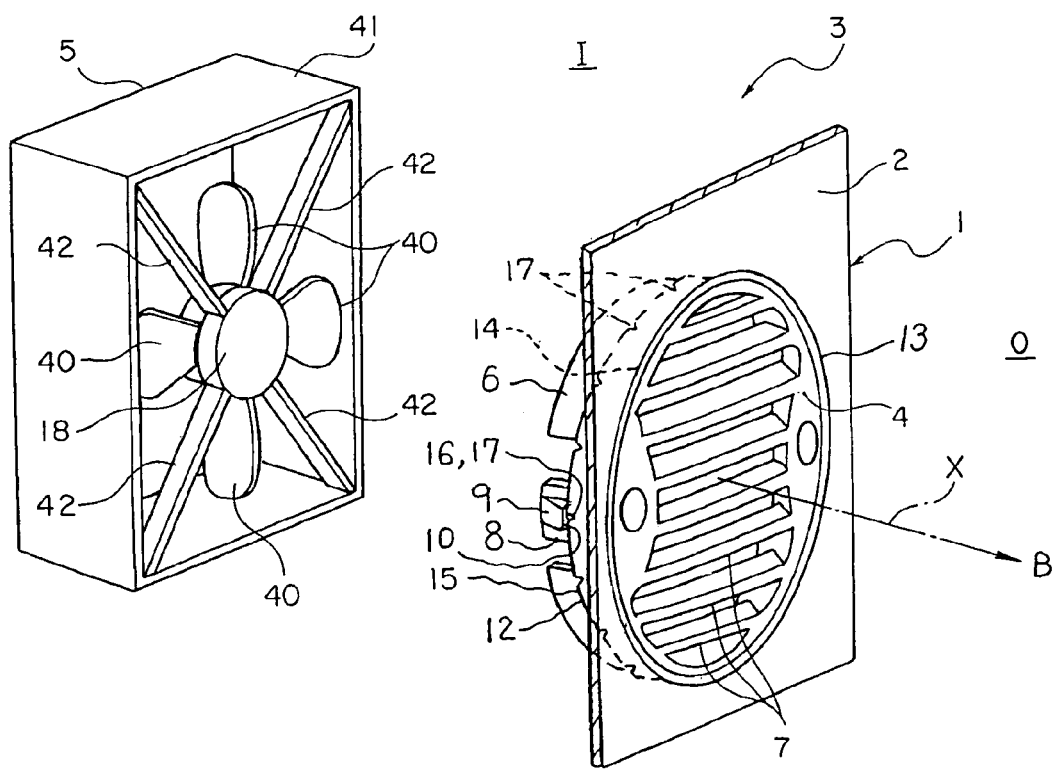
FIG. 2 is a perspective view of the exhaust device shown in FIG. 1 in which a louver is engaged with a bracket hole.

FIG. 1 is a perspective external view of an image forming apparatus 1. The image forming apparatus 1 is, for example, a printer. The image forming apparatus 1 includes an external cover 2 and an exhaust device 3 attached to the external cover 2. FIG. 2 is a perspective view of the exhaust device 3. A portion inside the external cover 2 is indicated by I, and a portion outside of the external cover 2 is indicated by O. This system is followed also in FIG. 9.

Figure 3:
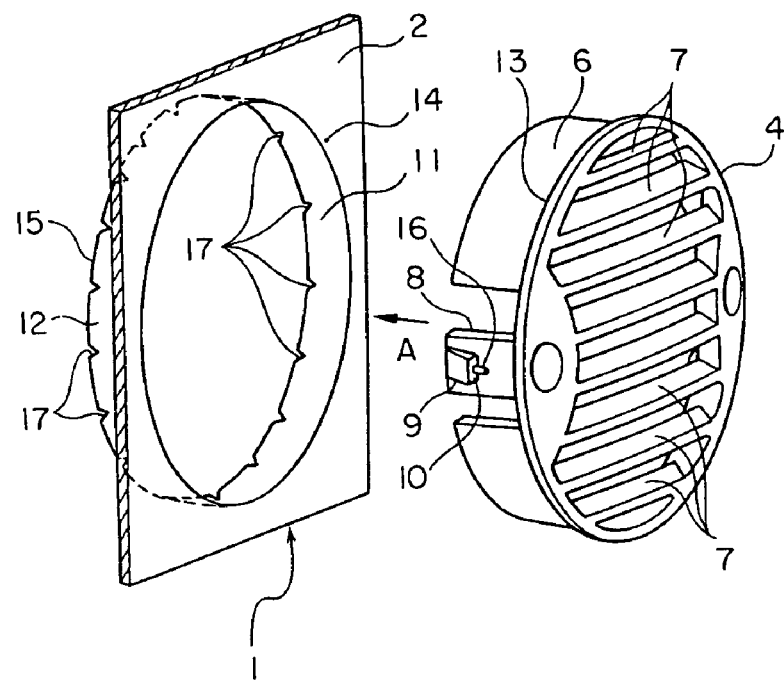
FIG. 3 is a perspective view of the exhaust device shown in FIG. 2 in which the louver is removed from the bracket hole.
Figure 4:
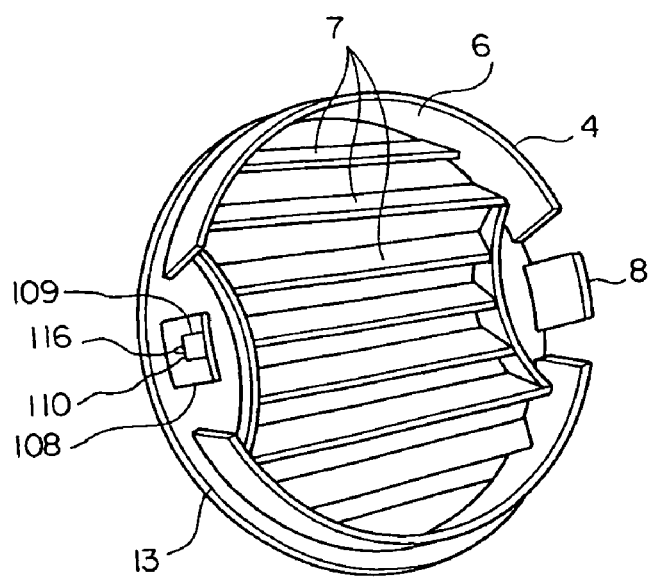
FIG. 4 is a perspective view of the backside of the louver shown in FIGS. 2 and 3.
Figure 5:
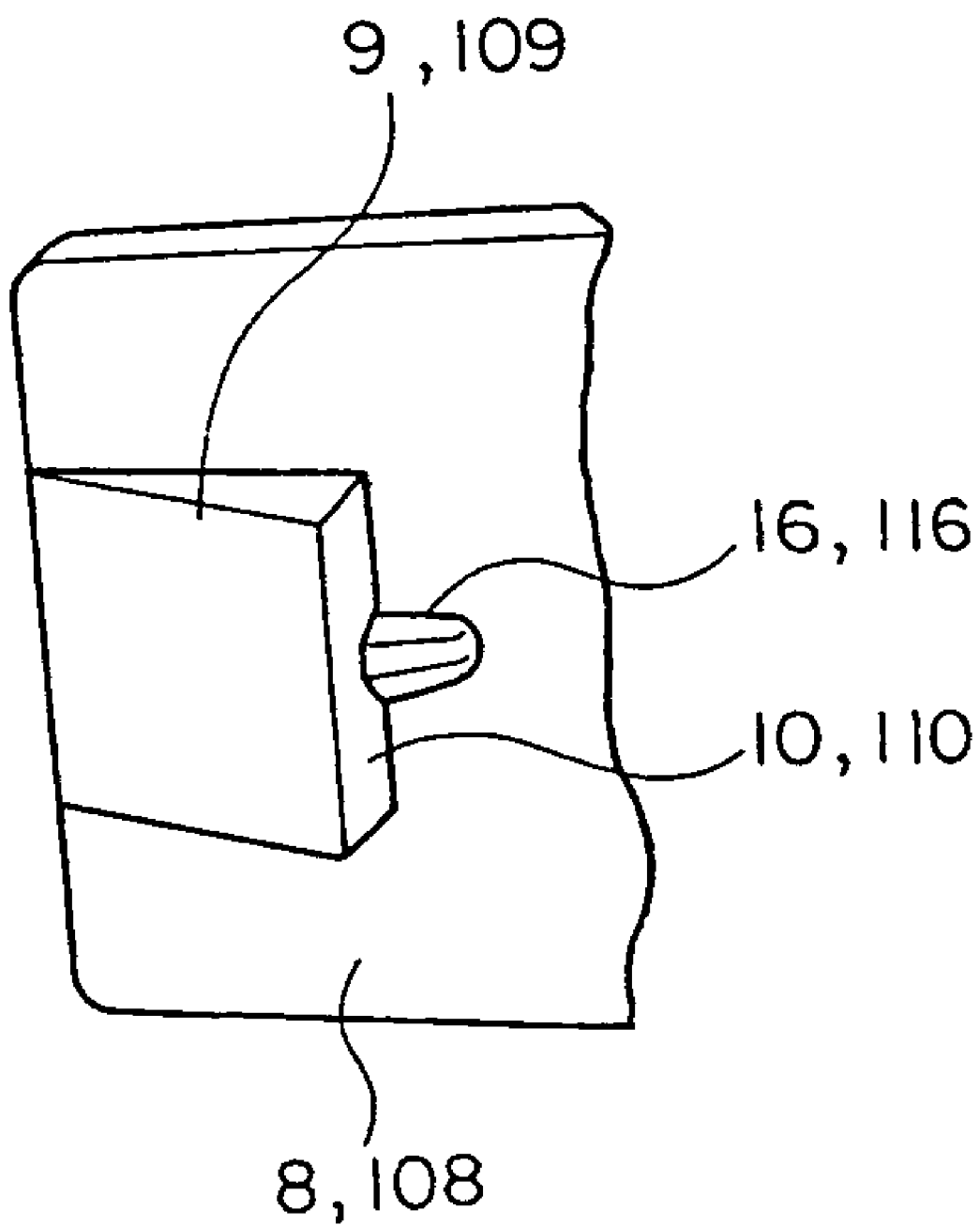
FIG. 5 is an enlarged view of locking pawls provided on the louver.

The exhaust device 3 includes a louver 4 and a fan 5. The louver 4 is detachably mounted on the external cover 2 (also see FIG. 1) and the fan 5 is fixed inside the image forming apparatus 1. FIG. 3 is a perspective view of the louver 4 that is detached from the external cover 2. FIG. 4 is a perspective of the louver 4 as viewed from inside the external cover 2, i.e., "backside" of the louver 4.

As shown in FIG. 3 and FIG. 4, the louver 4 includes a cylindrical peripheral wall 6 and multiple blades 7 that are fixed to one edge of the peripheral wall 6 in the axial direction. The blades 7 are arrayed in a lattice shaped formation. Two cantilevered tongues 8 and 108 opposite to each other are provided in the peripheral wall 6. Each of the tongues 8 and 108 is elastically deformable. Protruding locking pawls 9 and 109 are provided on the external surface of the tongues 8 and 108, respectively. As shown in FIG. 2 through FIG. 5, the locking pawls 9 and 109 include shoulders 10 and 110, respectively, which rise from the respective surfaces of the tongues 8 and 108.

As shown in FIG. 3, a circular bracket hole 11 is provided in the external cover 2 of the image forming apparatus 1. A circular wall 12 that is part of the external cover 2 configures the bracket hole 11.

As indicated by an arrow A shown in FIG. 3, the peripheral wall 6 of the louver 4 is inserted in the bracket hole 11. As shown in FIG. 2, upon insertion, a ring shaped projection 13 having a marginally larger diameter than the diameter of the peripheral wall 6 touches an external cover portion 14 around the bracket hole 11. The locking pawls 9 and 109 that extend respectively from the tongues 8 and 108 of the louver 4 traverse the circular wall 12 that configures the bracket hole 11, and the shoulders 10 and 110 of the respective locking pawls 9 and 109 engage with an edge 15 of the bracket hole 11, thereby preventing the louver 4 from slipping out of the bracket hole 11. When the louver 4 is pulled away from the bracket hole 11 in a direction indicated by an arrow B in FIG. 2, the tongues 8 and 108 elastically deform and the locking pawls 9 and 109 provided respectively on the tongues 8 and 108 are disengaged from the edge 15 of the bracket hole 11, thereby enabling to remove the louver 4 from the bracket hole 11. Thus, the louver 4 is detachably engaged with the bracket hole 11.

As shown in FIG. 2, the fan 5 includes a frame 41, a motor 18 that is fixed to the frame 41 via a stay 42, and blades 40 that are rotatably driven by the motor 18. When the louver 4 is engaged with the bracket hole 11, the motor 18 of the fan 5 is operated to rotate the blades 40 and air inside the image forming apparatus 1 that is biased by the fan 5 is discharged outside the image forming apparatus 1 via the slits between the blades 7 of the louver 4. Thus, the fan 5 is fixed inside the image forming apparatus 1 upstream in the airflow direction than the louver 4.

Air inside the image forming apparatus 1 is discharged by using the exhaust device 3, thereby enabling to prevent the temperature from rising excessively inside the image forming apparatus 1.

However, if the image forming apparatus 1 is located near a seat in an office, the discharged air can cause discomfort to a person occupying the seat. Especially, heat, dust particles and odor of the discharged air is likely to cause great discomfort.

In the exhaust device 3, the louver 4 is engaged with the bracket hole 11 such that the louver 4 can be freely rotated without restrictions in angle or direction. Torque is applied manually to the louver 4 engaged with the bracket hole 11, thereby enabling the louver 4 to rotate freely around a central axis (center of rotation) X. The louver 4 can rotate not only 360°, but in any angle exceeding 360° without restriction. Further, the louver 4 engaged with the bracket hole 11 can freely rotate in a clockwise direction as well as in a counterclockwise direction.

Figure 6:
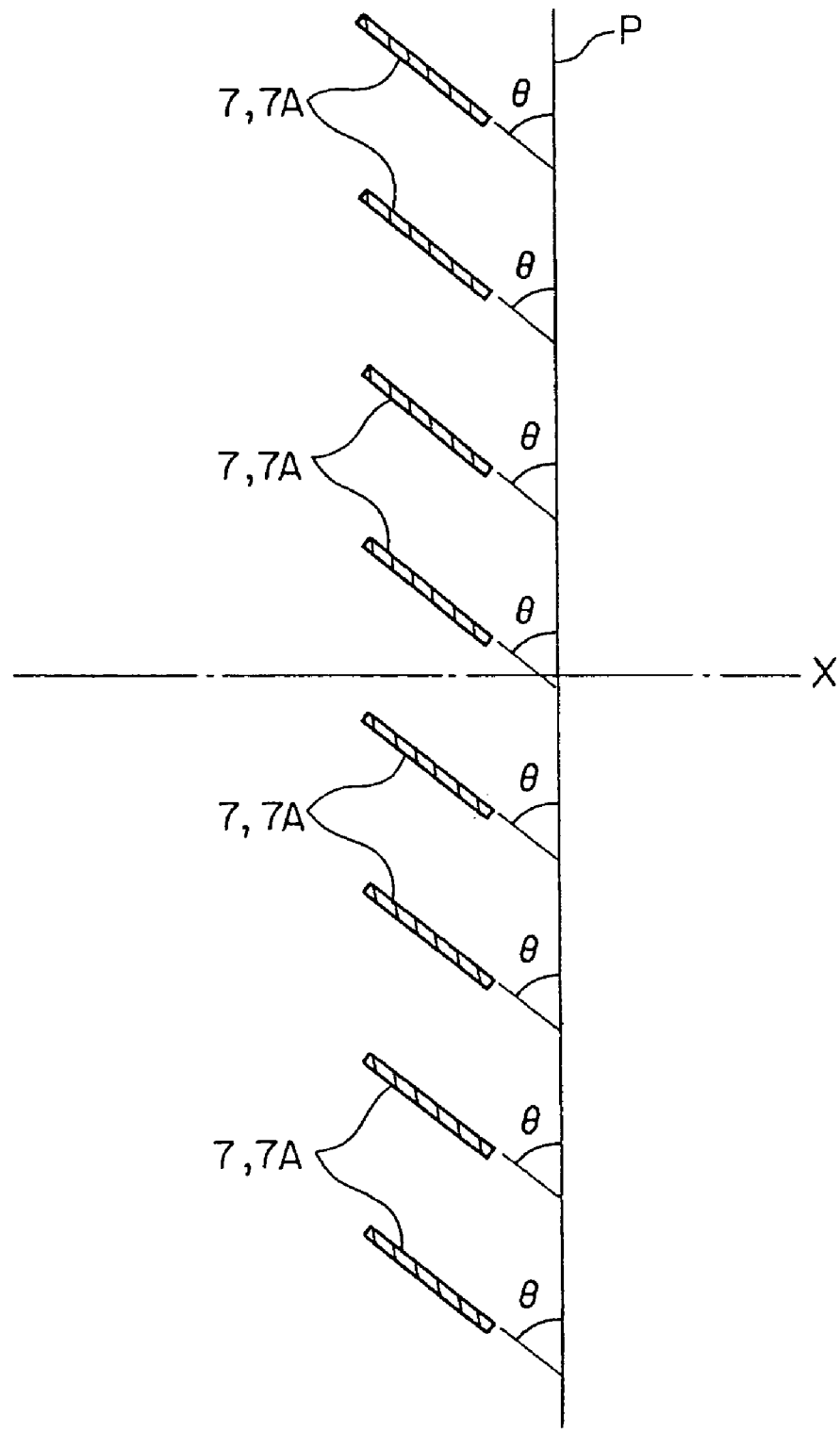
FIG. 6 depicts an array of blades of the louver.

As shown in FIG. 6, the blades 7 form an angle θ with a plane P that is perpendicular to the central axis X of the louver 4, where the angle θ is set between 0° and 90°. Due to this, it is possible to change the flow direction of air discharged via the louver 4 by freely rotating the louver 4. Thus, by controlling the flow direction of air, the discharged air can be kept away from a person occupying the seat near the image forming apparatus 1, thereby preventing discomfort to the person. Moreover, because the louver 4 can be freely rotated without restrictions in angle or direction, the flow direction of the air discharged via the louver 4 can be easily controlled with a single touch. In the conventional exhaust device, because the fan is attached to the louver and the louver rotates along with the fan, the louver cannot be rotated over an angle exceeding 360° so as not to cut a fan motor harness, thereby reducing the operability of the exhaust device when controlling the flow direction of air. However, in the exhaust device 3 according to the embodiment, because the louver 4 and the fan 5 are provided separately, the louver 4 can be freely rotated in any angle and any direction without restrictions.

In the exhaust device 3 according to the present embodiment, the louver 4 is provided with the locking pawls 9 and 109 that detachably engage with the edge 15 of the bracket hole 11 to hold the louver 4 in the bracket hole 11, thereby enabling to detach the louver 4 easily from the bracket hole 11 without using a tool such as a driver. Thus, upon accumulation of dirt, the louver 4 can be easily cleaned.

As shown in FIG. 2 through FIG. 5, projections 16 and 116 are provided on the tongues 8 and 108, respectively, on the respective shoulders 10 and 110. A plurality of concave portions 17 are provided on the edge 15 of the circular wall 12 with spaces in the peripheral direction. The projections 16 and 116 engage with the concave portions 17, thereby providing the operator with a clicking feel when rotating the louver 4.

Figure 7:
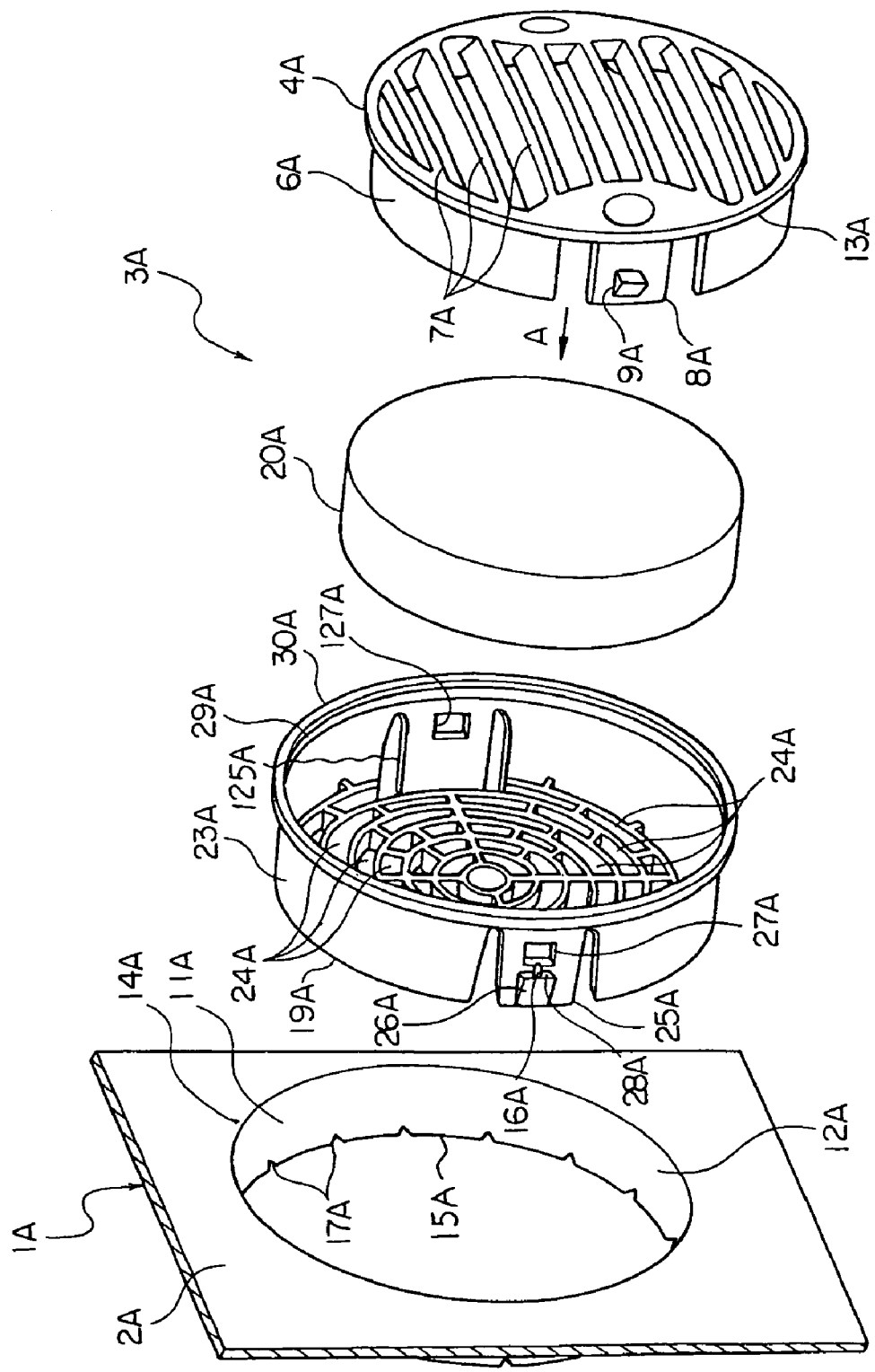
FIG. 7 is a perspective view of another example of the exhaust device shown in FIG. 2.
Figure 12:
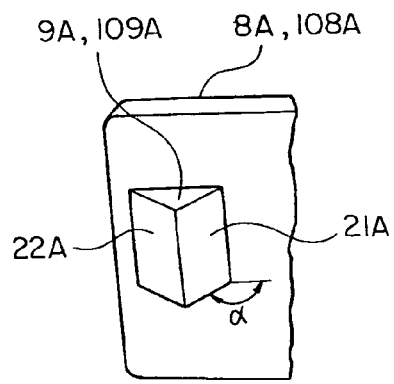
FIG. 12 is an enlarged view of locking projections of the louver shown in FIGS. 7 and 10.

FIG. 7 through FIG. 13 depict another example of the exhaust device. An exhaust device 3A shown in FIG. 7 includes a louver 4A, a holder 19A that holds the louver 4A, a filter 20A, and a fan 5A (see FIG. 9). Similarly to the louver 4 shown in FIG. 2 through FIG. 5, the louver 4A includes a cylindrical peripheral wall 6A and multiple blades 7A that are fixed to one edge of the peripheral wall 6A in the axial direction. The blades 7A are arrayed in a lattice shaped formation. As shown in FIG. 7 though FIG. 10, two cantilevered tongues 8A and 108A are provided opposite each other in the peripheral wall 6A. The tongues 8A and 108A are elastically deformable. Locking projections 9A and 109A are provided on the tongues 8A and 108A, respectively. As shown in FIG. 12, the locking projections 9A and 109A are triangular in shape and include two slanting faces 21A and 22A.

Figure 13:
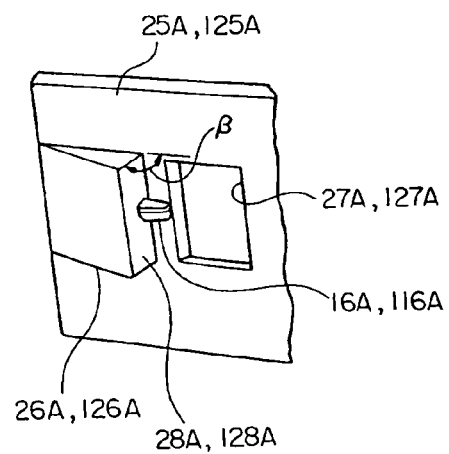
FIG. 13 is an enlarged view of locking pawls shown in FIG. 11.

As shown in FIG. 7 through FIG. 10, the holder 19A is cup shaped and includes a circular peripheral wall 23A. Multiple vent holes 24A are provided in the bottom surface of the holder 19A. Two cantilevered tongues 25A and 125A are provided opposite to each other in the peripheral wall 23A. The cantilevered tongues 25A and 125A are elastically deformable. A locking pawl 26A and a locking hole 27A are provided on the tongue 25A. A locking pawl 126A and a locking hole 127A are provided on the tongue 125A (see FIG. 11). As shown in FIG. 13, the locking pawls 26A and 126A include shoulders 28A and 128A, respectively, which rise from the respective surface of the tongues 25A and 125A.

Figure 8:
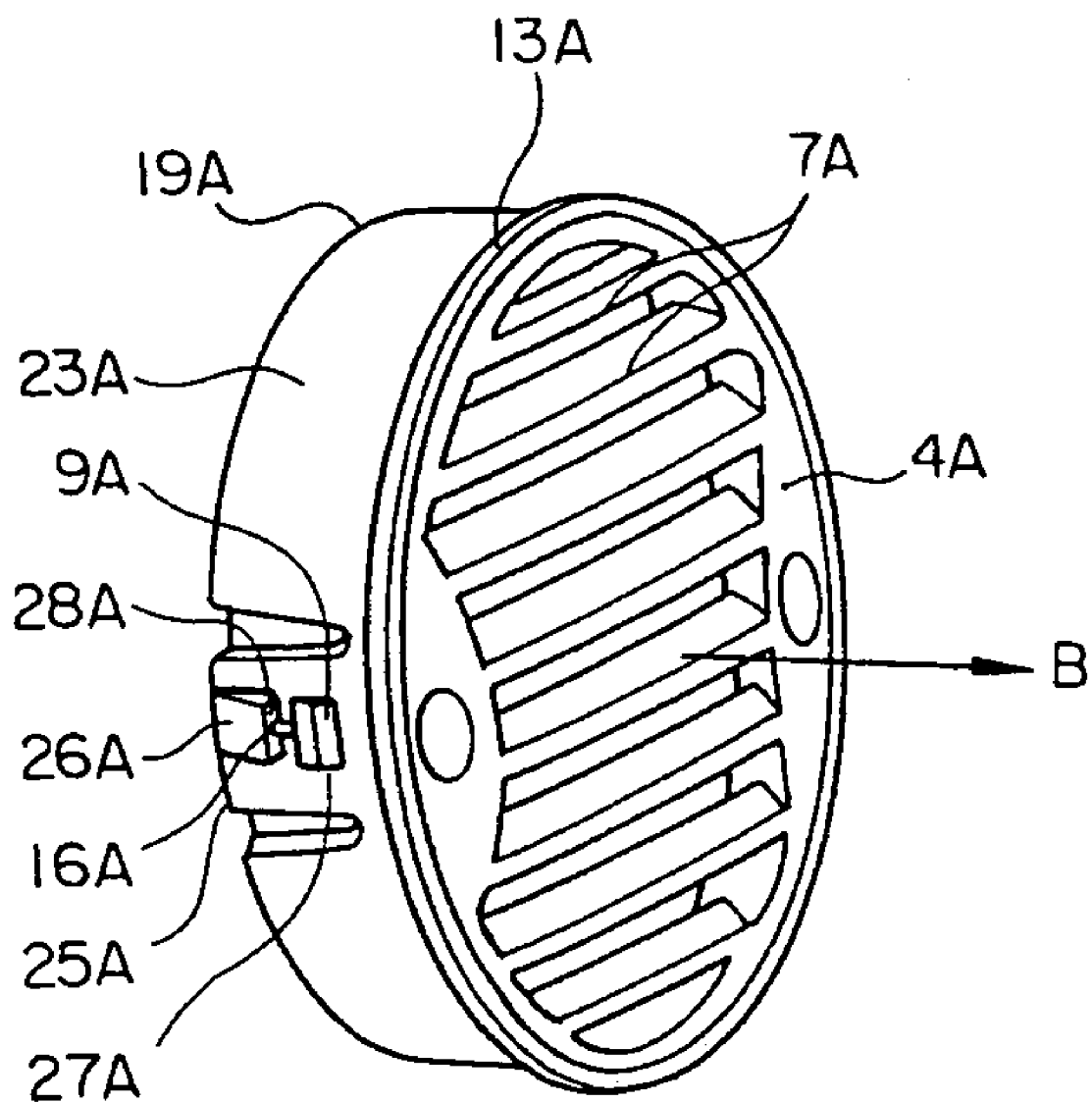
FIG. 8 depicts a locked state of a louver and a holder of the exhaust device shown in FIG. 7.

As indicated by the arrow A shown in FIG. 7, the peripheral wall 6A of the louver 4A is fit inside the peripheral wall 23A of the holder 19A. As shown in FIG. 8, when the louver 4A and the holder 19A are attached to each other, a ring shaped projection 13A of the louver 4A touches an edge 29A (see FIG. 7) of the peripheral wall 23A, and the locking projections 9A and 109A that are provided on the louver 4A are engaged with the locking holes 27A and 127A, respectively. Due to this, the holder 19A and the louver 4A are locked together. When the holder 19A and the louver 4A are locked together, the vent holes 24A provided on the holder 19A are positioned opposite the blades 7A provided on the louver 4A.

When the louver 4A is attached to the holder 19A, an internal space is formed. The filter 20A is accommodated inside the internal space. As shown in FIG. 8, if the holder 19A is pressed by hand and the louver 4 is pulled away in the direction indicated by the arrow B, the tongues 8A and 108A of the louver 4A are elastically deformed, the locking projections 9A and 109A that are provided on the tongues 8A and 108A respectively are removed from the respective locking holes 27A and 127A, and the louver 4A can be detached from the holder 19A.

Figure 9:
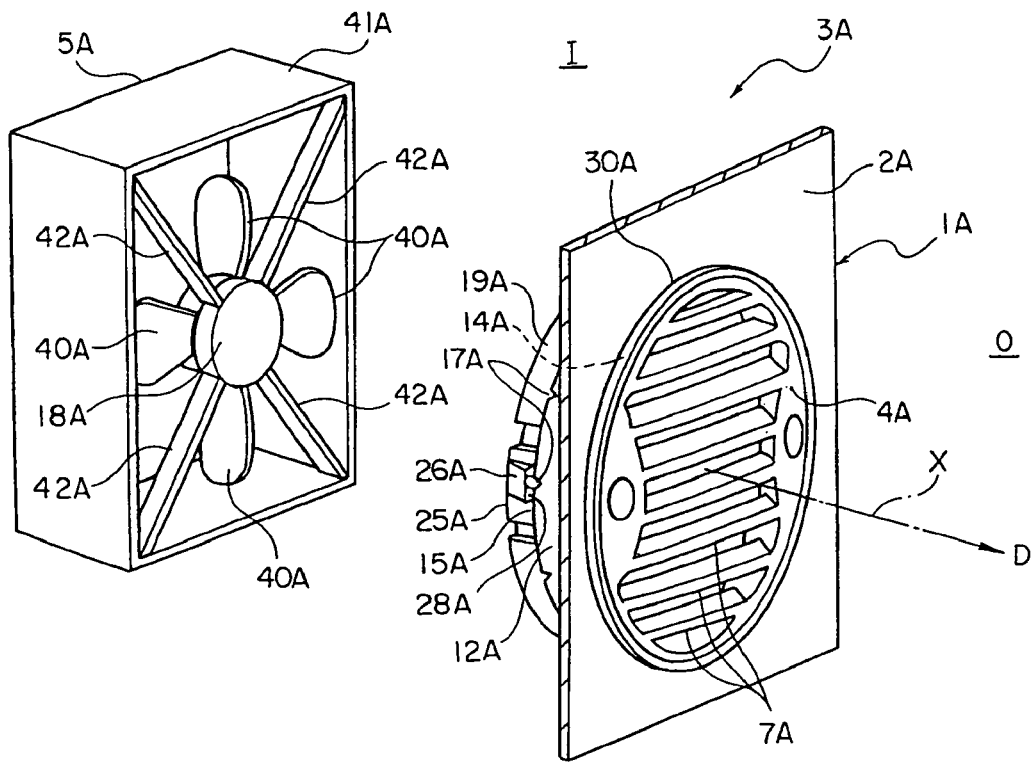
FIG. 9 is a perspective view of the exhaust device shown in FIG. 7 in which the holder with the attached louver is engaged with a bracket hole.
Figure 10:
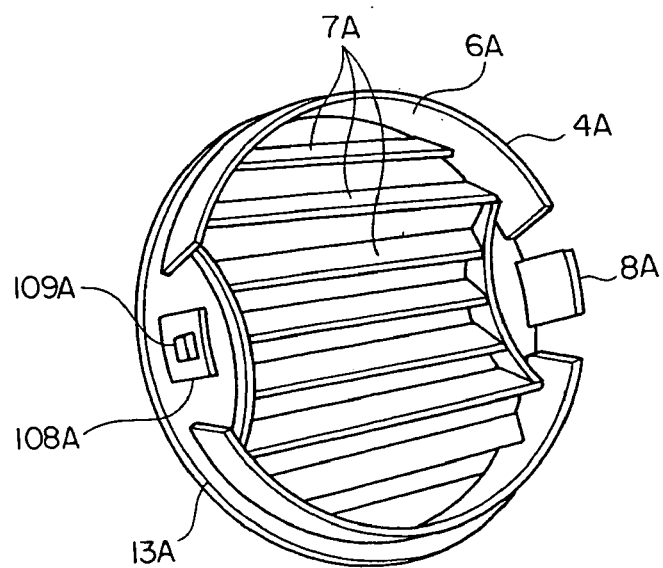
FIG. 10 is a perspective view of the backside of the louver shown in FIG. 7.
Figure 11:
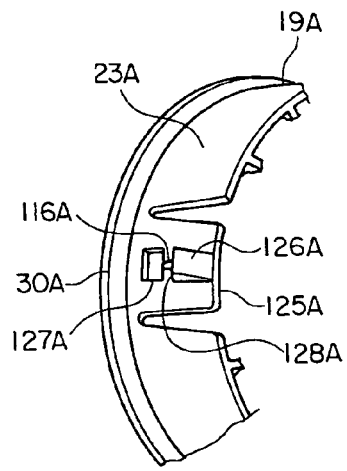
FIG. 11 depicts the backside of the holder shown in FIG. 7.

As shown in FIG. 7, a bracket hole 11A is provided in an external cover 2A of an image forming apparatus 1A. The bracket hole 11A is the same as the bracket hole 11 shown in FIG. 3. As shown in FIG. 9, when the holder 19A locked with the louver 4A is engaged with the bracket hole 11A, a ring shaped projection 30A having a marginally larger diameter than the diameter of the peripheral wall 23A of the holder 19A touches an external cover portion 14A around the bracket hole 11A, the locking pawls 26A and 126A that extend respectively from the tongues 25A and 125A of the holder 19A traverse a circular wall 12A that configures the bracket hole 11A and the shoulders 28A and 128A of the respective locking pawls 26A and 126A engage with an edge 15A of the bracket hole 11A, thereby preventing the holder 19A and the louver 4 from slipping out of the bracket hole 11A. As shown in FIG. 9, if the holder 19A is pulled away in a direction indicated by an arrow D, the tongues 25A and 125A elastically deform and the locking pawls 26A and 126A are disengaged from the edge 15A of the bracket hole 11A, thereby enabling to remove the holder 19A that holds the louver 4A from the bracket hole 11A. Thus, the holder 19A and the louver 4A are detachably engaged with the bracket hole 11A.

The fan 5A shown in FIG. 9 is similar to the fan 5 shown in FIG. 2, and includes a frame 41A, a motor 18A that is supported by the frame 41A via a stay 42A, and blades 40A that are rotatably driven by the motor 18A.

As shown in FIG. 9, when the holder 19A that holds the louver 4A is engaged with the bracket hole 11A (FIG. 7), the motor 18A is operated to rotate the blades 40A of the fan 5A and air inside the image forming apparatus 1 flows via the vent holes 24A of the holder 19A into the internal space configured by the holder 19A and the louver 4A and passes through the filter 20A. Next, the air passes through the slits between the blades 7A and is discharged outside the image forming apparatus 1. Thus, the fan 5A in the example shown in FIG. 7 through FIG. 9 is also fixed inside the image forming apparatus 1 upstream in the airflow direction than the holder 19A and the louver 4A.

At least one of the functions of dust control, ozone removal, and deodorization is provided in the filter 20A. An air freshener can be placed in the internal space between the louver 4A and the holder 19A instead of the filter 20A.

Thus, as shown in FIG. 7 through FIG. 13, the exhaust device 3A includes the louver 4A consisting of the multiple blades 7A that are arrayed in a lattice shaped formation, the holder 19A that is detachably engaged with the louver 4A and holds the louver 4A, the filter 20A that is accommodated in the internal space formed when the holder 19A and the louver 4A are engaged with each other, and the fan 5A that is positioned upstream in the airflow direction than the holder 19A and the louver 4A. When the holder 19A and the louver 4A are engaged with each other, the vent holes 24A provided in the holder 19A are positioned opposite the blades 7A.

In the exhaust device 3A according to the present embodiment, the holder 19A and the louver 4A are engaged with the bracket hole 11A that is provided in the external cover 2A of the image forming apparatus 1A such that the holder 19A and the louver 4A can be freely rotated without restrictions in angle or direction. In other words, the holder 19A and the louver 4A attached to the bracket hole 11A can rotate not only 360°, but in any angle exceeding 360° without restriction. Moreover, the holder 19A and the louver 4A can freely rotate in a clockwise direction as well as in a counterclockwise direction. Because the fan 5A and the holder 19A attached with the louver 4A are provided separately, the holder 19A and the louver 4A can be freely rotated.

As shown in FIG. 6, the blades 7A of the louver 4A are slanted. In other words, if the blades 7A form an angle θ with a plane P that is perpendicular to the central axis X of the holder 19A and the louver 4A, the angle θ is set between 0° and 90°.

In the exhaust device 3A, similarly as the exhaust device 3 shown in FIG. 2 through FIG. 5, the flow direction of air that is discharged via the louver 4A can be changed by manually rotating the louver 4A with the holder 19A, thereby enabling control of the flow direction of air such that the discharged air is kept away from a person occupying the seat near the image forming apparatus 1A. Moreover, because the louver 4A and the holder 19A can be freely rotated without restrictions in angle or direction, the flow direction of air that is discharged via the louver 4A can be easily controlled.

As shown in FIG. 7 through FIG. 9, FIG. 11, and FIG. 13, in the exhaust device 3A according to the present embodiment, projections 16A and 116A are provided on the tongues 25A and 125A respectively next to the shoulders 28A and 128A of the locking pawls 26A and 126A, respectively. A plurality of concave portions 17A is provided on the edge 15A of the circular wall 12A of the external cover 2A with spaces in the peripheral direction. The projections 16A and 116A engage with the concave portions 17A, thereby providing the operator with a clicking feel when rotating the holder 19A.

In the exhaust device 3A according to the present embodiment, the holder 19A is provided with the locking pawls 26A and 126A that detachably engage with the edge 15A of the bracket hole 11A to keep the holder 19A in the bracket hole 11A, thereby enabling to detach the holder 19A easily from the bracket hole 11A without using a tool. Thus, upon accumulation of dirt, the holder 19A can be easily cleaned.

The locking projections 9A and 109A provided on the louver 4A detachably engage with the respective locking holes 27A and 127A provided on the holder 19A to lock the holder 19A and the louver 4A, thereby enabling to easily detach the louver 4A from the holder 19A. Thus, the filter 20A accommodated in the space between the louver 4A and the holder 19A can be easily removed, exchanged, or cleaned.

The locking projections 9A and 109A and the locking holes 27A and 127A can also be detachably engaged with each other upon attaching the holder 19A and the louver 4A by providing the locking projections 9A and 109A on the holder 19A and the locking holes 27A and 127A on the louver 4A. Thus, by providing the locking projections on either one of the holder or the louver, and providing the locking holes on the other, the locking projections can be detachably engaged with the locking holes when the holder and the louver are attached to each other, thereby enabling to lock the holder and the louver.

Operation of exchanging the filter 20A can also be carried out by a single individual without the aid of a service technician. As shown in FIG. 9, when the holder 19A and the louver 4A are engaged with the bracket hole 11A of the external cover 2A, if the user pulls the louver 4A in a direction indicated by the arrow D, the louver 4A and the holder 19A are detached from the bracket hole 11A while being attached to each other. As shown in FIG. 7, the bracket hole 11A is left open facing the outer side. Due to this, the user may accidentally insert his or her hand through the bracket hole 11A and touch the fan 5A.

To avoid such an accident, in the exhaust device 3A, the amount of force required to remove the holder 19A from the bracket hole 11A is greater than the amount of force that is required to remove the louver 4A from the holder 19A.

To be specific, as shown in FIG. 12, when the holder 19A and the louver 4A are attached to each other, the slanting faces 21A on one side of the locking projections 9A and 109A engage with the edges of the locking holes 27A and 127A provided on the holder 19A. Similarly, as shown in FIG. 13, when the holder 19A is engaged with the bracket hole 11A, the shoulders 28A and 128A of the locking pawls 26A and 126A respectively engage with the edge 15A of the bracket hole 11A. If the slanting faces 21A of the locking projections 9A and 109A form an angle a with the surface of the tongues 8A and 108A respectively, and the shoulders 28A and 128A of the respective locking pawls 26A and 126A form an angle β with the surface of the tongues 25A and 125A respectively, each of the angles a and β are set such that a is greater than β. Due to this, if the user holds the louver 4A and pulls the louver 4A in a direction indicated by the arrow D shown in FIG. 9, the louver 4A is removed from the holder 19A, but the holder 19A stays in the bracket hole 11A. Therefore, the bracket hole 11A remains blocked by the holder 19A without being left open. The vent holes 24A provided in the holder 19A are too small for a person's finger to be inserted. Thus, the holder 19A ensures that the user is unable to insert his finger inside the bracket hole 11A, thereby ensuring safety of the user. Ensuring that the holder 19A is not removed from the bracket hole 11A also achieves the same result.

The holder 19A can be prevented from being removed from the bracket hole 11A even when the louver 4A is removed from the holder 19A when the user pulls the louver 4A in the direction indicated by the arrow D, by making the tongues 25A and 125A of the holder 19A thicker than the tongues 8A and 108A of the louver 4A, making the tongues 8A and 108A elastically deform more easily than the tongues 25A and 125A, and making the locking pawls 26A and 126A higher than the locking projections 9A and 109A.

The exhaust device according to the embodiments can be used in various devices other than the image forming apparatus.

According to the present invention, a louver can be freely rotated without restrictions in angle or direction, thereby enabling to control the flow direction of air that is discharged via the louver.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An exhaust device suitably used to exhaust air from an inside of a target apparatus to an outside thereof, comprising:
   a louver that includes a plurality of blades arrayed in a lattice, the louver being selectively lockable and detachably engaged with a peripheral wall portion of a through hole portion of a cover of the target apparatus and having a plurality of concave portions on an edge portion of said peripheral wall such that the louver can rotate freely in any of a clockwise direction and a counterclockwise direction when unlocked; and
   a fan unit positioned upstream in an airflow direction from the louver, wherein the fan unit is provided separately from the louver such that the fan unit does not rotate when the louver is rotated, wherein
   the blades form an angle between 0° and 90° with a plane that is perpendicular to a central axis of the louver,
   wherein the louver includes locking pawls that are selectively lockable with and detachably engaged with the concave portions of the peripheral wall of the through hole portion of the cover when the louver is engaged with the through hole portion of the cover.

2. An exhaust device suitably used to exhaust air from an inside of a target apparatus to an outside thereof, comprising:

a louver that includes a plurality of blades arrayed in a lattice;

a cup shaped holder that detachably engages with the louver, the holder being selectively lockable and detachably engaged with a peripheral wall portion of a through hole in a cover of the target apparatus and having a plurality of concave portions on an edge portion of said peripheral wall such that the louver and the holder can rotate freely in any of a clockwise direction and a counterclockwise direction when unlocked;

a filter that is accommodated in an internal space that is formed when the holder is engaged with the louver; and a fan unit positioned upstream in an airflow direction than the louver, wherein the fan unit is provided separately from the louver and the holder such that the fan unit does not rotate when the louver and the holder are rotated, wherein the holder includes vent holes that are positioned opposite the blades when the holder is engaged with the louver, and the blades form an angle between 0° and 90° with a plane that is perpendicular to a central axis of the holder and the louver, wherein the holder includes locking pawls that are selectively lockable with and detachably engaged with the peripheral wall edge of the concave portions of the through hole portion of the cover when the holder is engaged with the through hole in the cover.

3. The exhaust device according to claim 2, wherein the louver includes locking holes, and
the holder includes locking projections that detachably engage with the locking holes when the louver is engaged with the holder.

4. The exhaust device according to claim 2, wherein the holder includes locking holes, and
the louver includes locking projections that detachably engage with the locking holes when the louver is engaged with the holder.

5. The exhaust device according to claim 2, wherein first force required to remove the holder from the through hole is greater than second force required to remove the louver from the holder, and
the vent holes have a size that prevents insertion of a person's finger.

6. An image forming apparatus comprising:
a cover;
an image forming unit inside the cover; and
an exhaust device suitably used to exhaust air from an inside of the image forming apparatus to an outside thereof, including
a louver that includes a plurality of blades arrayed in a lattice, the louver being selectively lockable and detachably engaged with a peripheral wall of a through hole portion in the cover and having a plurality of concave portions on an edge portion of said peripheral wall such that the louver can be selectively lockable with and rotate freely in any of a clockwise direction and a counterclockwise direction when unlocked from the cover, and
a fan unit positioned upstream in an airflow direction than the louver, wherein the fan unit is provided separately from the louver such that the fan unit does not rotate when the louver is rotated, wherein the blades form an angle between 0° and 90° with a plane that is perpendicular to a central axis of the louver, wherein the louver includes locking pawls that are selectively lockable with and detachably engaged with the peripheral wall of the concave portions of the through hole in the cover when the louver is engaged with the through hole in the cover.

7. An image forming apparatus comprising:
a cover;
an image forming unit inside the cover; and
an exhaust device suitably used to exhaust air from an inside of the image forming apparatus to an outside thereof, including
a louver that includes a plurality of blades arrayed in a lattice,
a holder having a peripheral wall portion that is selectively lockable to and detachably engaged with the louver, the holder being detachably engaged with a through hole in the cover and having a plurality of concave portions on an edge portion of said peripheral wall such that the louver and the holder can rotate freely in any of a clockwise direction and a counterclockwise direction when unlocked from the cover,
a filter that is accommodated in an internal space that is formed when the holder is engaged with the louver, and
a fan unit positioned upstream in an airflow direction than the louver, wherein the fan unit is provided separately from the louver and the holder such that the fan unit does not rotate when the louver and the holder are rotated, wherein
the holder includes vent holes that are positioned opposite the blades when the holder is engaged with the louver, and
the blades form an angle between 0° and 90° with a plane that is perpendicular to a central axis of the holder and the louver,
wherein the louver includes locking pawls that are selectively lockable with and detachably engaged with the concave portions of the peripheral wall of the through hole in the cover when the louver is engaged with the through hole in the cover.

* * * * *